US007845967B1

(12) United States Patent  
Shu et al.

(10) Patent No.: US 7,845,967 B1  
(45) Date of Patent: Dec. 7, 2010

(54) USB MODULE WITH FLAT AND PROTRUDING PINS HAVING A PROTECTIVE COVER

(75) Inventors: Chung-Won Shu, Taipei (TW); Chih-Heng Chiu, Taipei (TW); Fang-Yi Lin, Taipei (TW); Chia-Hao Hsu, Yilan (TW); Yu-Hsiu Huang, Miaoli (TW); Chun-Han Lee, Taipei (TW)

(73) Assignee: Transcend Information, Inc., NeiHu Dist, Taipei (TW)

( * ) Notice: Subject to any disclaimer, the term of this patent is extended or adjusted under 35 U.S.C. 154(b) by 0 days.

(21) Appl. No.: 12/647,561

(22) Filed: Dec. 28, 2009

(30) Foreign Application Priority Data

Dec. 4, 2009 (TW) .............................. 98141500 A

(51) Int. Cl.  
*H01R 13/62* (2006.01)
(52) U.S. Cl. ...................................... 439/367
(58) Field of Classification Search .............. 439/367, 439/76.1, 131, 79  
See application file for complete search history.

(56) References Cited

U.S. PATENT DOCUMENTS

| | | | | |
|---|---|---|---|---|
| 2,690,543 A | * | 9/1954 | Mackensen | ................. 439/367 |
| 4,621,884 A | * | 11/1986 | Berkebile et al. | ........... 439/367 |
| 4,915,638 A | * | 4/1990 | Domian | ...................... 439/142 |
| 5,256,072 A | * | 10/1993 | Hatagishi | ...................... 439/79 |
| 6,457,984 B1 | * | 10/2002 | Montgomery et al. | ....... 439/131 |
| 7,438,562 B2 | * | 10/2008 | Ni et al. | ......................... 439/79 |
| 7,614,916 B2 | * | 11/2009 | Jow | ............................. 439/630 |
| 7,766,672 B1 | * | 8/2010 | Chiang | ...................... 439/76.1 |
| 2007/0066102 A1 | * | 3/2007 | Takemoto et al. | ........... 439/131 |
| 2008/0032561 A1 | | 2/2008 | Hiew | |

FOREIGN PATENT DOCUMENTS

TW       M337787      8/2008

* cited by examiner

*Primary Examiner*—Chandrika Prasad  
(74) *Attorney, Agent, or Firm*—Winston Hsu; Scott Margo

(57) ABSTRACT

A USB storage device includes a casing, a USB module and a protecting cover. The USB module is disposed in the casing and comprises a plurality of protruding pins. Each of the protruding pins has a first height. The protecting cover is connected to the casing and selectively covers the USB module. The protecting cover has a surface and an accommodating space formed on the surface. When the protecting cover completely covers the USB module, the protruding pins are accommodated in the accommodating space. A second height is defined between a bottom of the accommodating space and the surface. The second height is larger than the first height of the protruding pin.

17 Claims, 22 Drawing Sheets

USB MODULE WITH FLAT AND PROTRUDING PINS HAVING A PROTECTIVE COVER

BACKGROUND OF THE INVENTION

1. Field of the Invention

The preferred embodiment relates to a universal serial bus (USB) storage device and, more particularly, to a USB storage device adapted to chip on board (COB) process.

2. Description of the Prior Art

Nowadays, USB is the most popular peripheral bus in computer industry and consumer electronic products. USB can be used to connect various peripheral devices, such as keyboard, mouse, flash driver, card reader, digital camera, personal digital assistant (PDA), smart phone, and so on. Due to plug and play capability and usage convenience, USB is available to most of applications in the market. So far there are lots of USB applications developed by peripheral and computer manufactures and there are also lots of drivers and programs developed correspondingly.

At present, a data transmission rate of USB 2.0 is 480 Mbps, and a data transmission rate of USB 3.0 is 5 Gbps, which is five times that of USB 2.0. Compared with USB 2.0, USB 3.0 may save much power. Furthermore, USB 3.0 is compatible with USB 2.0. Referring to FIGS. 1 and 2, FIG. 1 is a perspective view illustrating a conventional USB 3.0 plug 1, and FIG. 2 is a perspective view illustrating the USB 3.0 plug 1, which is shown in FIG. 1, equipped with a protecting casing 3. As shown in FIG. 1, the USB 3.0 plug 1 comprises four USB 2.0 flat pins 10 and five protruding pins 12. To prevent the protruding pins 12 from being damaged due to collision or other accidents, the conventional USB 3.0 plug 1 is always equipped with the protecting casing 3, as shown in FIG. 2. In general, the protecting casing 3 is made of metal, such as iron.

At present, most of portable electronic devices have a tendency to small size. The USB plug can be manufactured by chip on board process without the protecting casing 3, so as to achieve small size. However, if the aforesaid USB 3.0 plug 1 is manufactured by chip on board process, the five protruding pins 12 will be exposed out of the circuit board, such that the protruding pins 12 may be damaged due to collision or other accidents.

SUMMARY OF THE INVENTION

Therefore, an objective of the preferred embodiment is to provide a USB storage device, which is adapted to chip on board process and capable of protecting USB plug effectively, so as to achieve small size.

A USB storage device of one preferred embodiment comprises a casing, a USB module and a protecting cover. The USB module is disposed in the casing and comprises a plurality of protruding pins, wherein each of the protruding pins has a first height. The protecting cover is connected to the casing and selectively covers the USB module. The protecting cover has a surface and an accommodating space formed on the surface. When the protecting cover completely covers the USB module, the protruding pins are accommodated in the accommodating space, a second height is defined between a bottom of the accommodating space and the surface, and the second height is larger than the first height.

A protecting structure of a portable storage device of another preferred embodiment comprises a casing and a protecting cover. The casing comprises a storage module disposed therein. The storage module has a plurality of flat pins and a plurality of protruding pins. The protecting cover is connected to the casing and selectively covers the casing. The protecting cover has an accommodating space opposite to the protruding pins, such that the protruding pins are accommodated in the accommodating space without contacting the protecting cover when the protecting cover covers the casing.

According to the aforesaid embodiments, when the USB module (i.e. portable storage device) is manufactured by chip on board process, the exposed protruding pins can be accommodated in the accommodating space of the protecting cover, so as to prevent the protruding pins from being damaged due to collision or other accidents.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
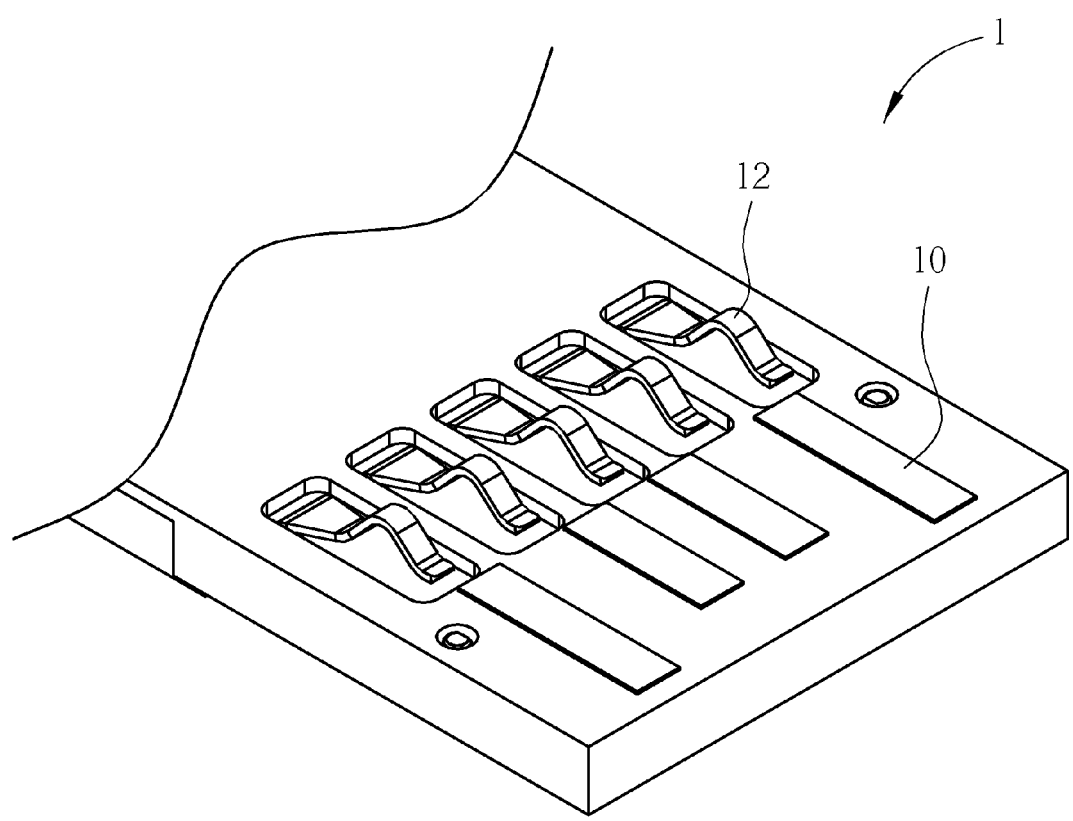
FIG. 1 is a perspective view illustrating a conventional USB 3.0 plug.
Figure 2:
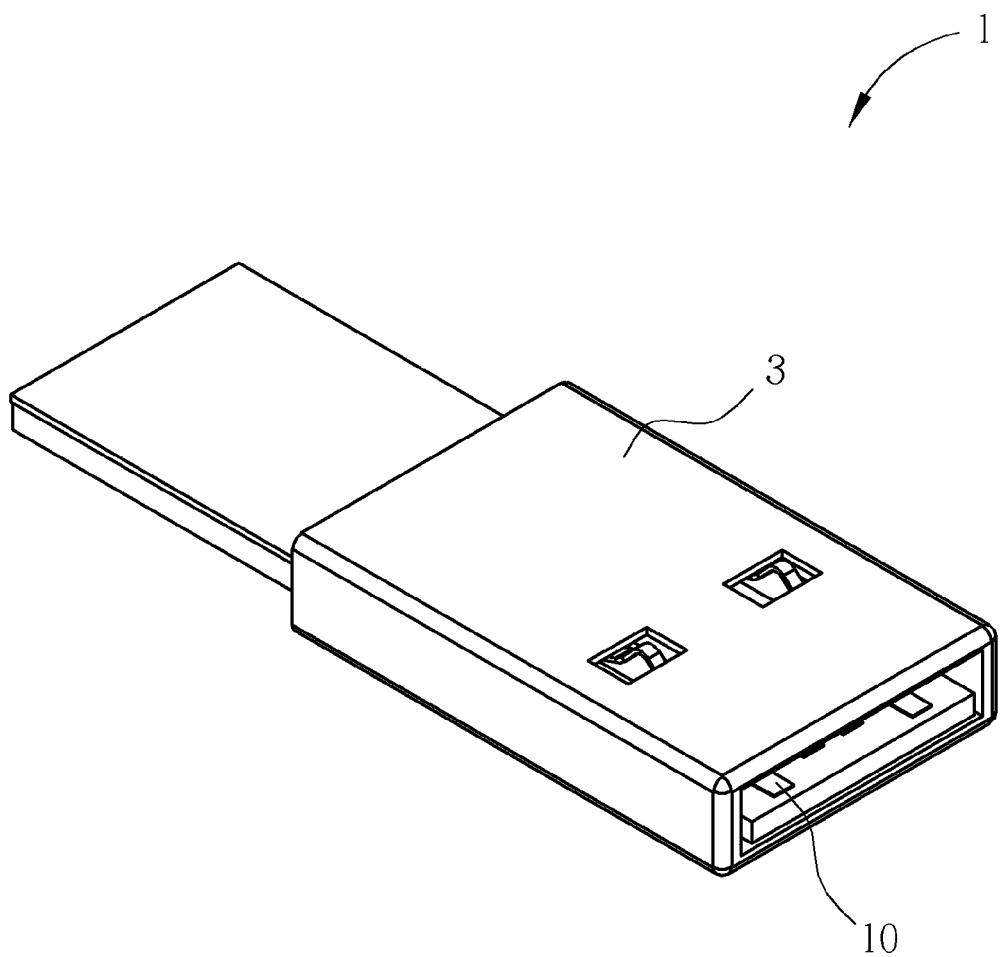
FIG. 2 is a perspective view illustrating the USB 3.0 plug, which is shown in FIG. 1, equipped with a protecting casing.
Figure 3:
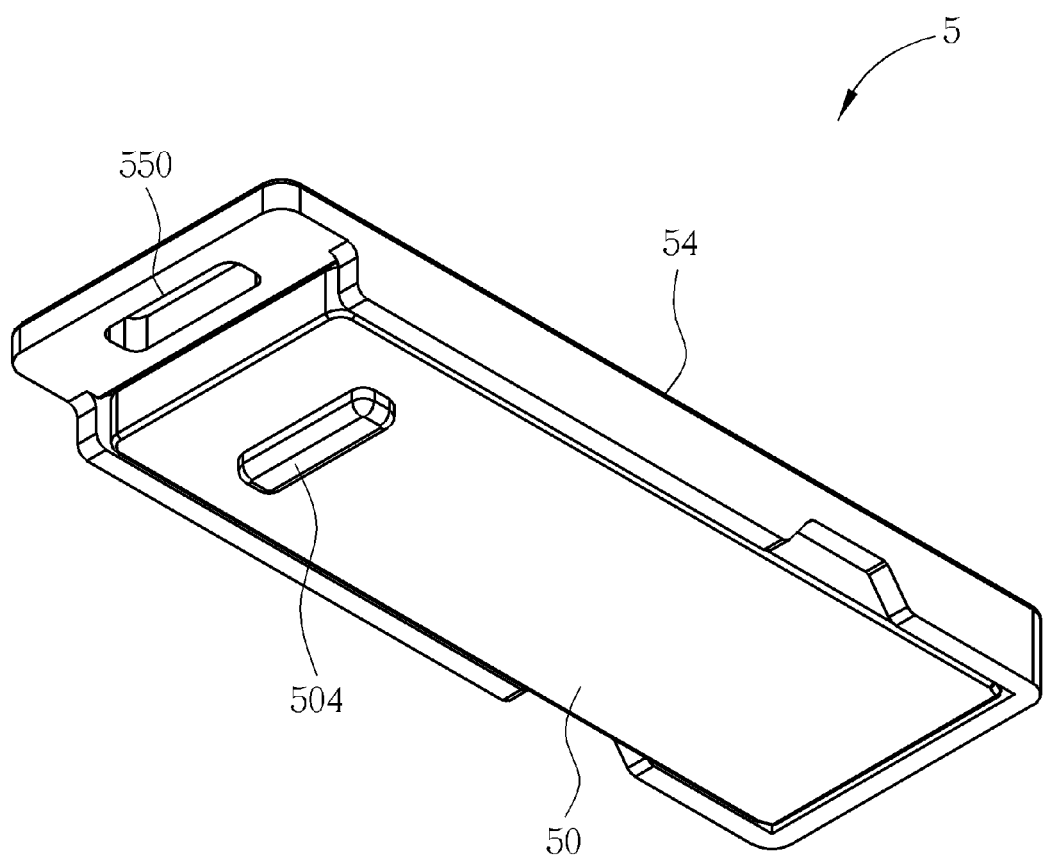
FIG. 3 is a perspective view illustrating a USB storage device according to one preferred embodiment.
Figure 4:
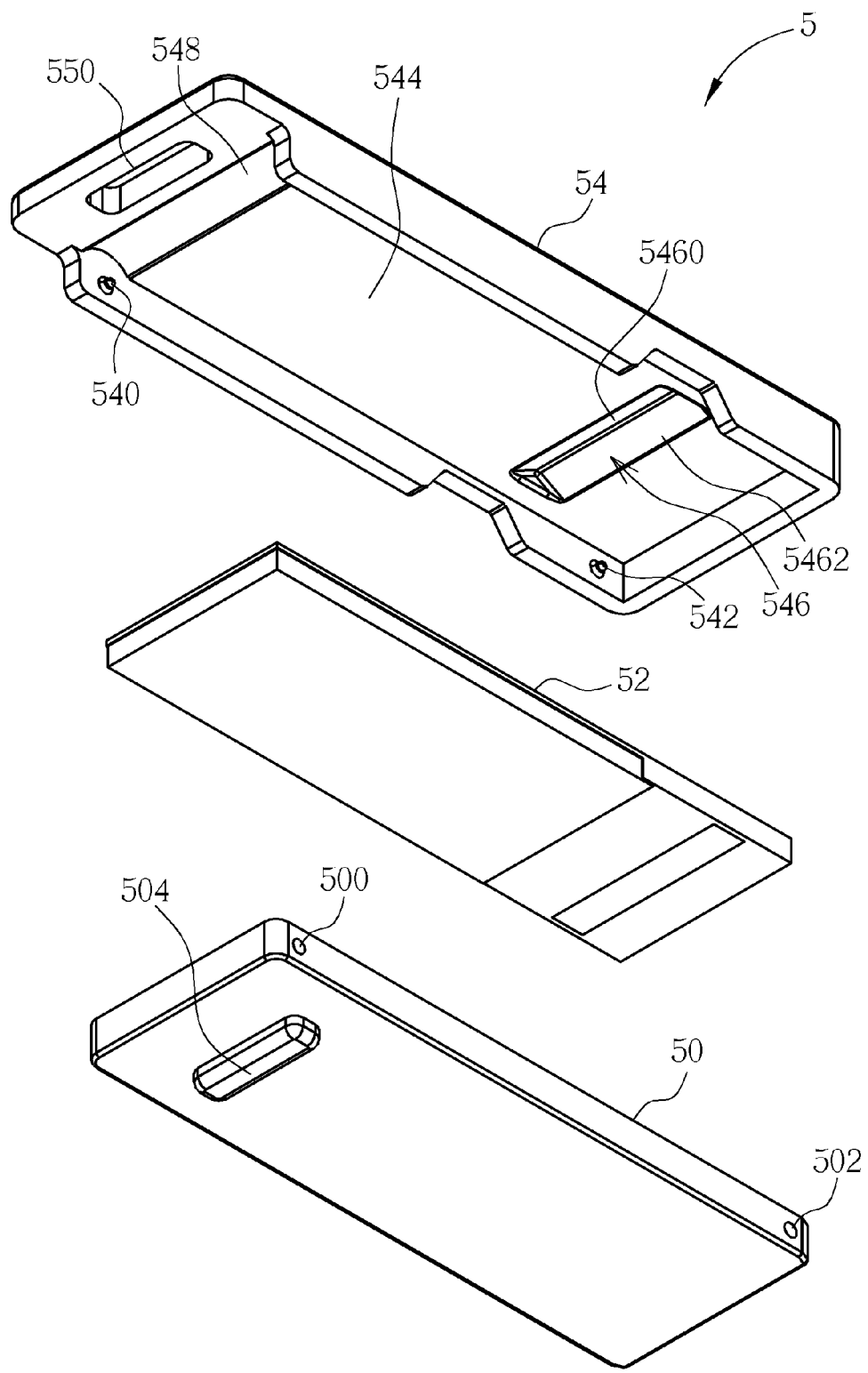
FIG. 4 is an exploded view illustrating the USB storage device shown in FIG. 3.
Figure 5:
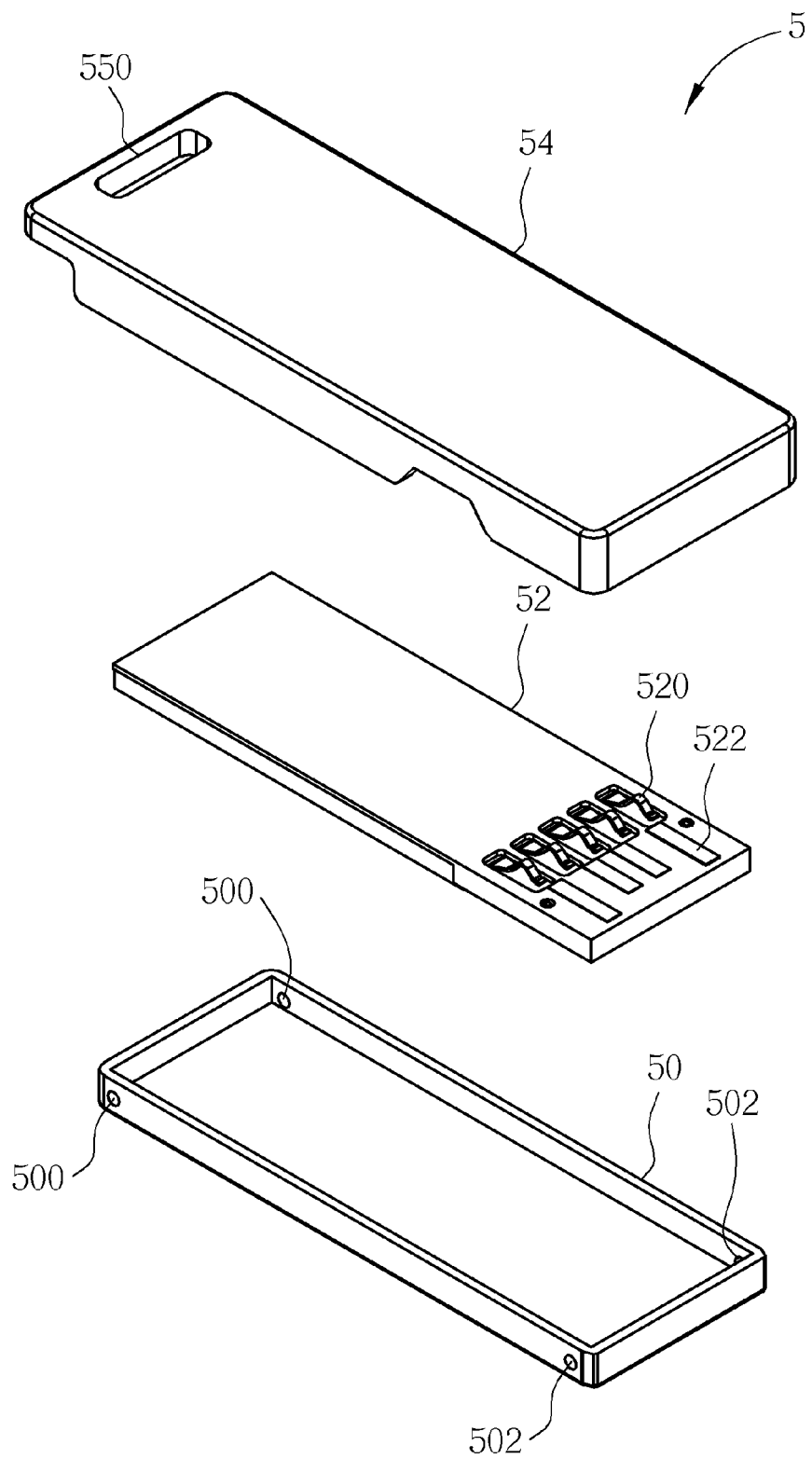
FIG. 5 is an exploded view illustrating the USB storage device shown in FIG. 3 in another view angle.
Figure 6:
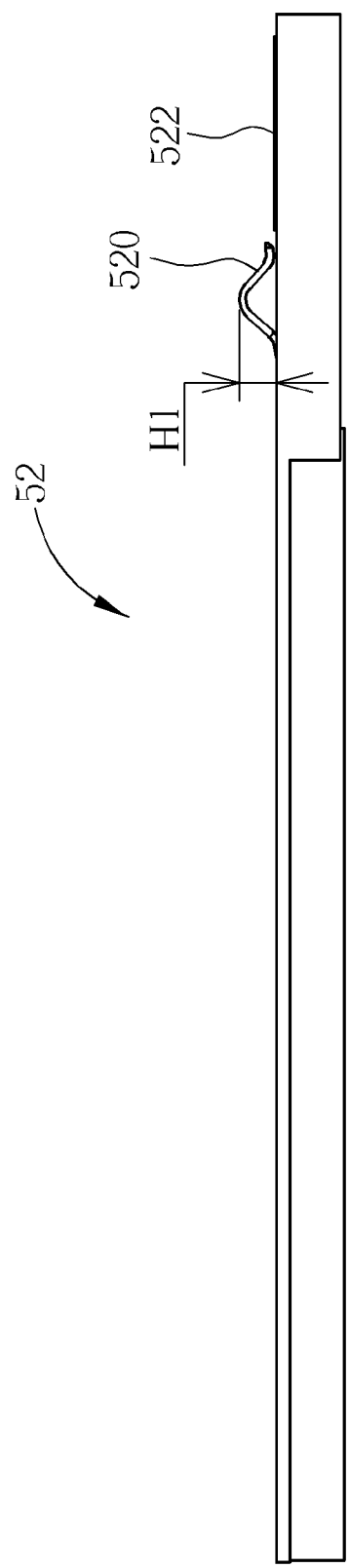
FIG. 6 is a side view illustrating the USB module shown in FIG. 5.

Referring to FIGS. 3 to 6, FIG. 3 is a perspective view illustrating a USB storage device 5 according to one preferred embodiment, FIG. 4 is an exploded view illustrating the USB storage device 5 shown in FIG. 3, FIG. 5 is an exploded view illustrating the USB storage device 5 shown in FIG. 3 in another view angle, and FIG. 6 is a side view illustrating the USB module 52 shown in FIG. 5. As shown in FIGS. 3 to 5, the USB storage device 5 (i.e. portable storage device) comprises a casing 50, a USB module 52 (i.e. storage module) and a protecting cover 54. In practical applications, the USB module 52 is disposed in the casing 50 and the protecting cover 54 is connected to the casing 50. The protecting cover 54 can be operated to selectively cover or expose the USB module 52.

In this embodiment, each of both sides of the casing 50 has a first pivoting portion 500 and each of both sides of the protecting cover 54 has a second pivoting portion 540. The first pivoting portion 500 of the casing 50 is pivotally connected to the second pivoting portion 540 of the protecting cover 54, such that the casing 50 is capable of rotating with respect to the protecting cover 54. Furthermore, each of both sides of the casing 50 has a first engaging portion 502 and each of both sides of the protecting cover 54 has a second engaging portion 542. The first engaging portion 502 of the casing 50 is engaged with the second engaging portion 542 of the protecting cover 54 when the protecting cover 54 completely covers the USB module 52, as shown in FIG. 3. It should be noted that, due to view angle, FIG. 4 only shows one side of the casing 50 with the first pivoting portion 500 and the first engaging portion 502 and one side of the protecting cover 54 with the second pivoting portion 540 and the second engaging portion 542. In this embodiment, the first pivoting portion 500 and the first engaging portion 502 may be holes, and the second pivoting portion 540 and the second engaging portion 542 may be pillars correspondingly. However, the first pivoting portion 500 and the first engaging portion 502 may be also pillars, and the second pivoting portion 540 and the second engaging portion 542 may be also holes correspondingly. In other words, the first pivoting portion 500, the first engaging portion 502, the second pivoting portion 540 and the second engaging portion 542 can be designed based on practical applications and are not limited to the type shown in FIGS. 4 and 5.

As shown in FIGS. 5 and 6, the USB module 52 comprises a plurality of protruding pins 520 and a plurality of flat pins 522, wherein each of the plurality of protruding pins has a first height H1. In this embodiment, the USB module 52 is in compliance with USB 3.0 standard, the flat pins 522 are in compliance with USB 2.0 standard, and the first height H1 of each protruding pins 520 is 0.6 mm.

Figure 7:
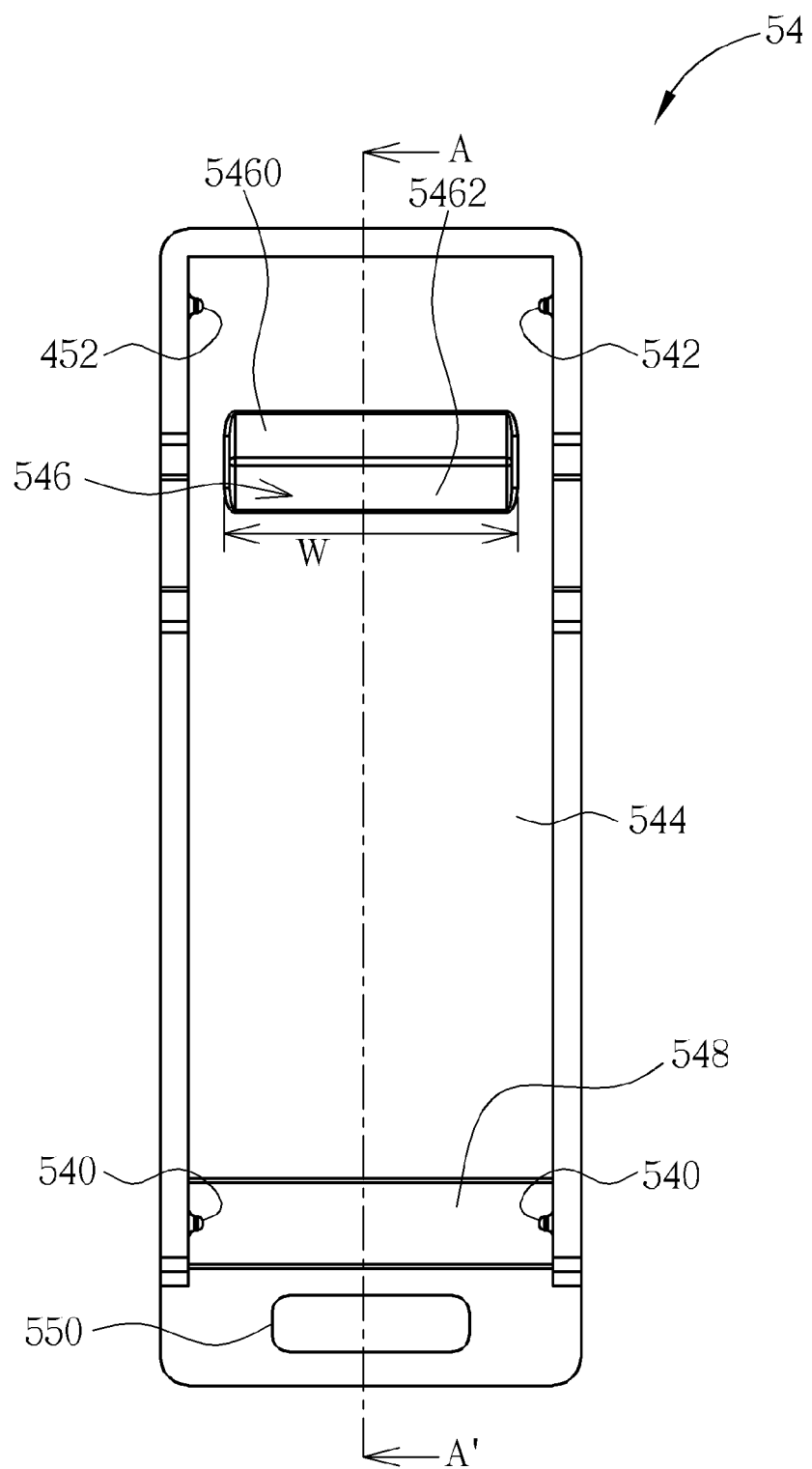
FIG. 7 is a bottom view illustrating the protecting cover shown in FIG. 4.
Figure 8:
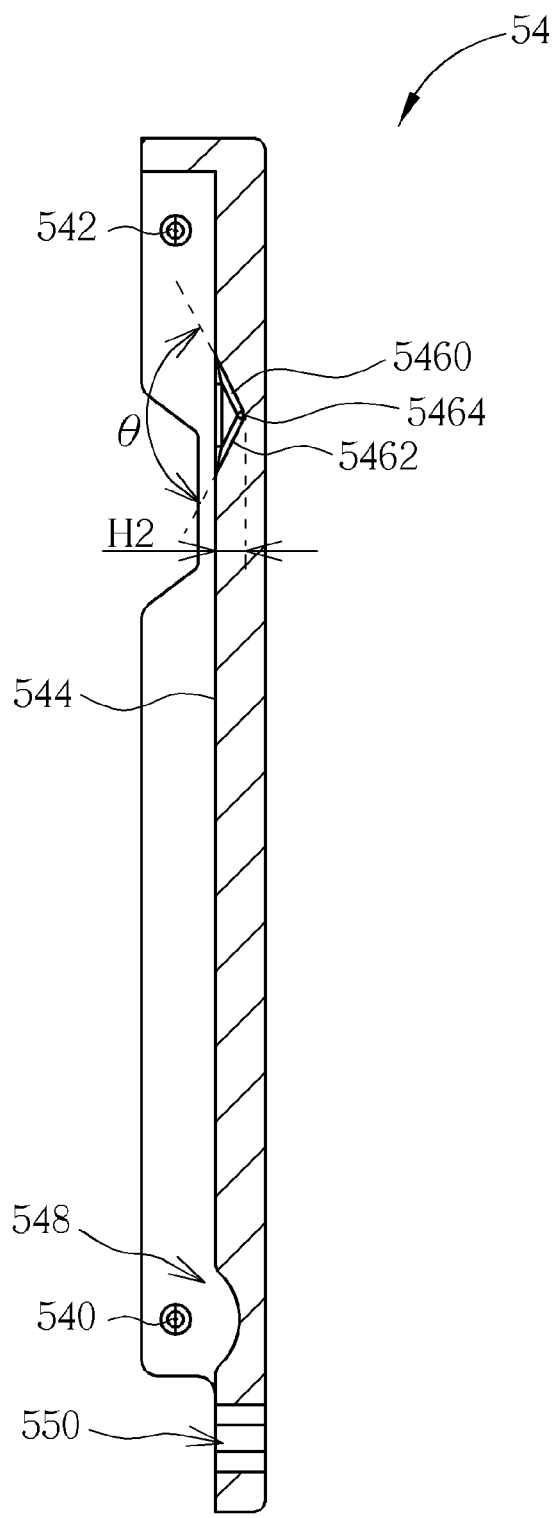
FIG. 8 is a sectional view illustrating the protecting cover along line A-A' shown in FIG. 7.

As shown in FIG. 4, the protecting cover 54 has a surface 544 and an accommodating space 546 formed on the surface 544. When the protecting cover 54 is connected to the casing 50 and covers the USB module 52, the protruding pins 520 can be accommodated in the accommodating space 546 without contacting the protecting cover 54, so as to achieve the purpose of protecting the protruding pins 520. In this embodiment, the accommodating space 546 consists of two inclined planes 5460 and 5462. Referring to FIGS. 7 and 8, FIG. 7 is a bottom view illustrating the protecting cover 54 shown in FIG. 4, and FIG. 8 is a sectional view illustrating the protecting cover 54 along line A-A' shown in FIG. 7. As shown in FIG. 7, a width W of the accommodating space 546 of this embodiment may be, but not limited to, 8.5 mm. As shown in FIG. 8, an angle θ between the inclined planes 5460 and 5462 of this embodiment may be, but not limited to, 120 degrees. Moreover, in this embodiment, a second height H2 is defined between the surface 544 and a bottom 5464 of the accommodating space 546. It is preferred that the second height H2 may be larger than, but not limited to, 0.8 mm.

Figure 9:
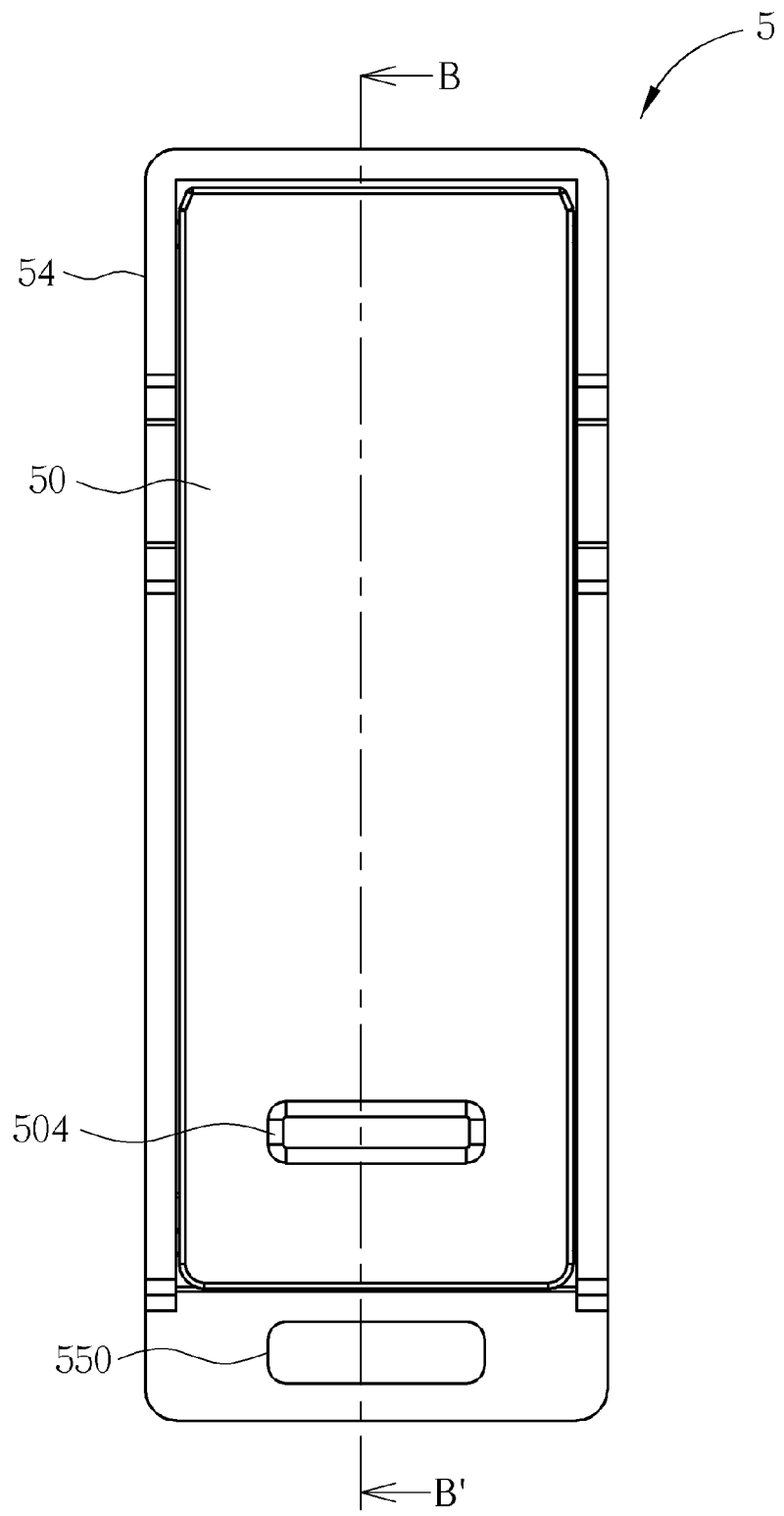
FIG. 9 is a bottom view illustrating the USB storage device shown in FIG. 3.
Figure 10:
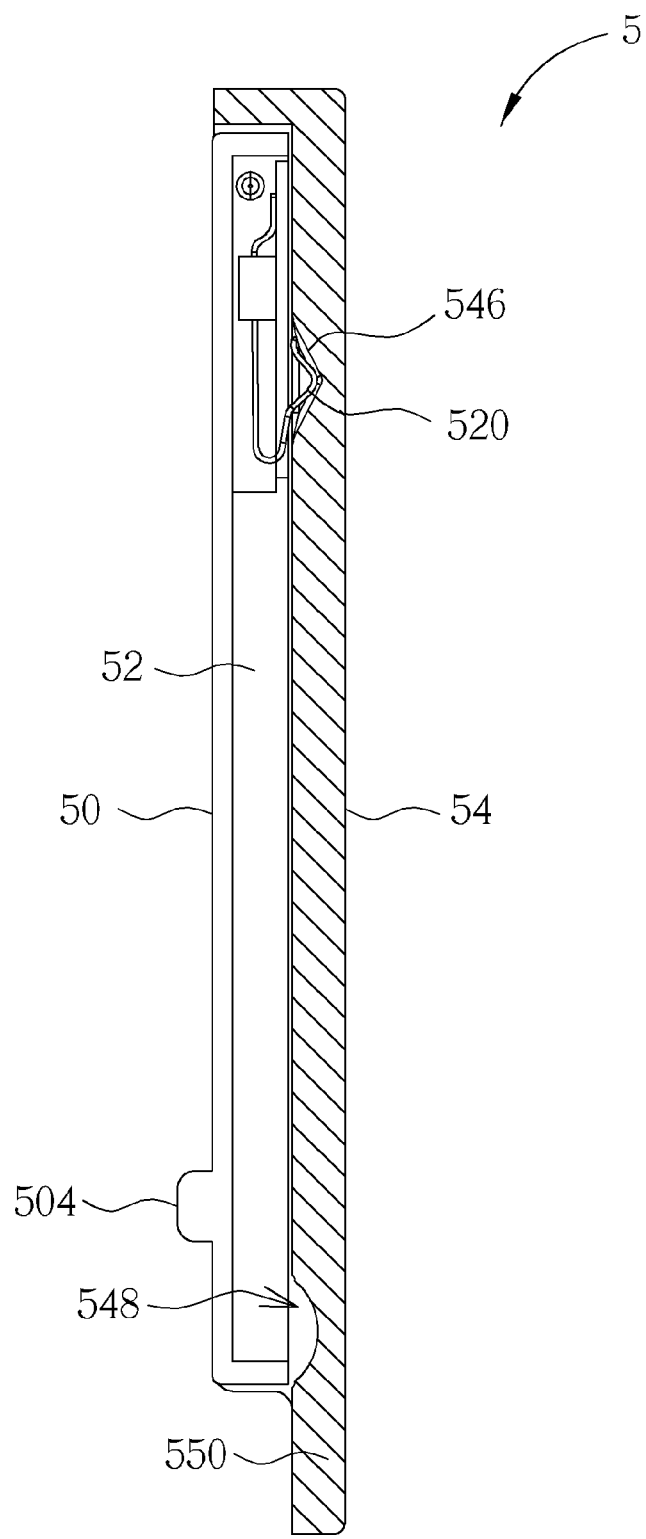
FIG. 10 is a sectional view illustrating the USB storage device along line B-B' shown in FIG. 9.

Referring to FIGS. 9 and 10, FIG. 9 is a bottom view illustrating the USB storage device 5 shown in FIG. 3, and FIG. 10 is a sectional view illustrating the USB storage device 5 along line B-B' shown in FIG. 9. As shown in FIGS. 9 and 10, when the protecting cover 54 completely covers the USB module 52, the protruding pins 520 are accommodated in the accommodating space 546. As mentioned in the above, under USB 3.0 standard, the first height H1 of each protruding pin 520 is 0.6 mm, and the second height H2 between the surface 544 and the bottom 5464 of the accommodating space 546 is larger than 0.8 mm. Accordingly, after using the USB storage device 5, the protruding pins 520 can be accommodated in the accommodating space 546 without contacting the protecting cover 54. Therefore, the USB module 52 can be manufactured by chip on board process and the exposed protruding pins 520 can be accommodated in the accommodating space 546 of the protecting cover 54, so as to prevent the protruding pins 520 from being damaged due to collision or other accidents.

Figure 11:
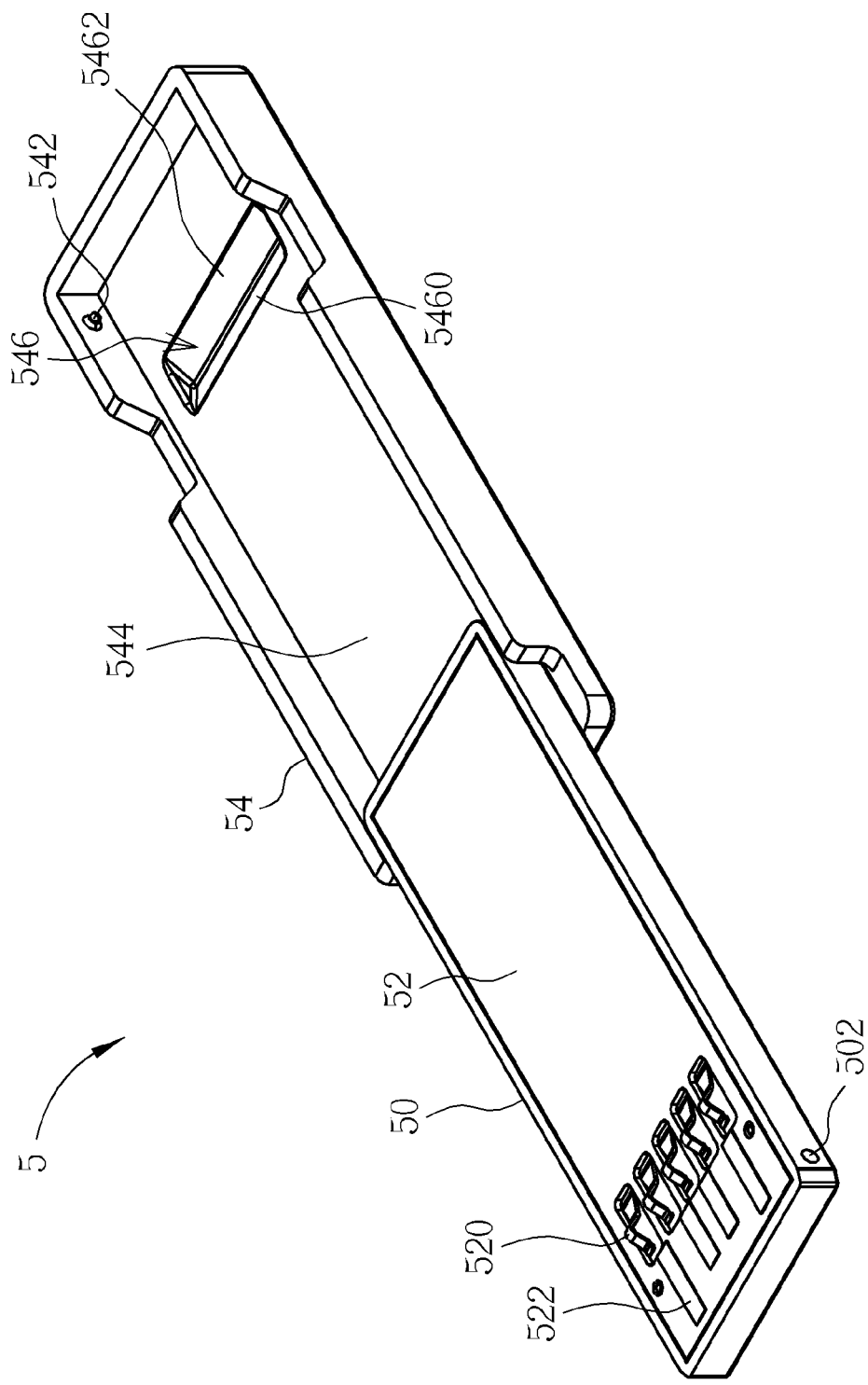
FIG. 11 is a perspective view illustrating the casing shown in FIG. 3 rotating with respect to the protecting cover with 180 degrees.
Figure 12:
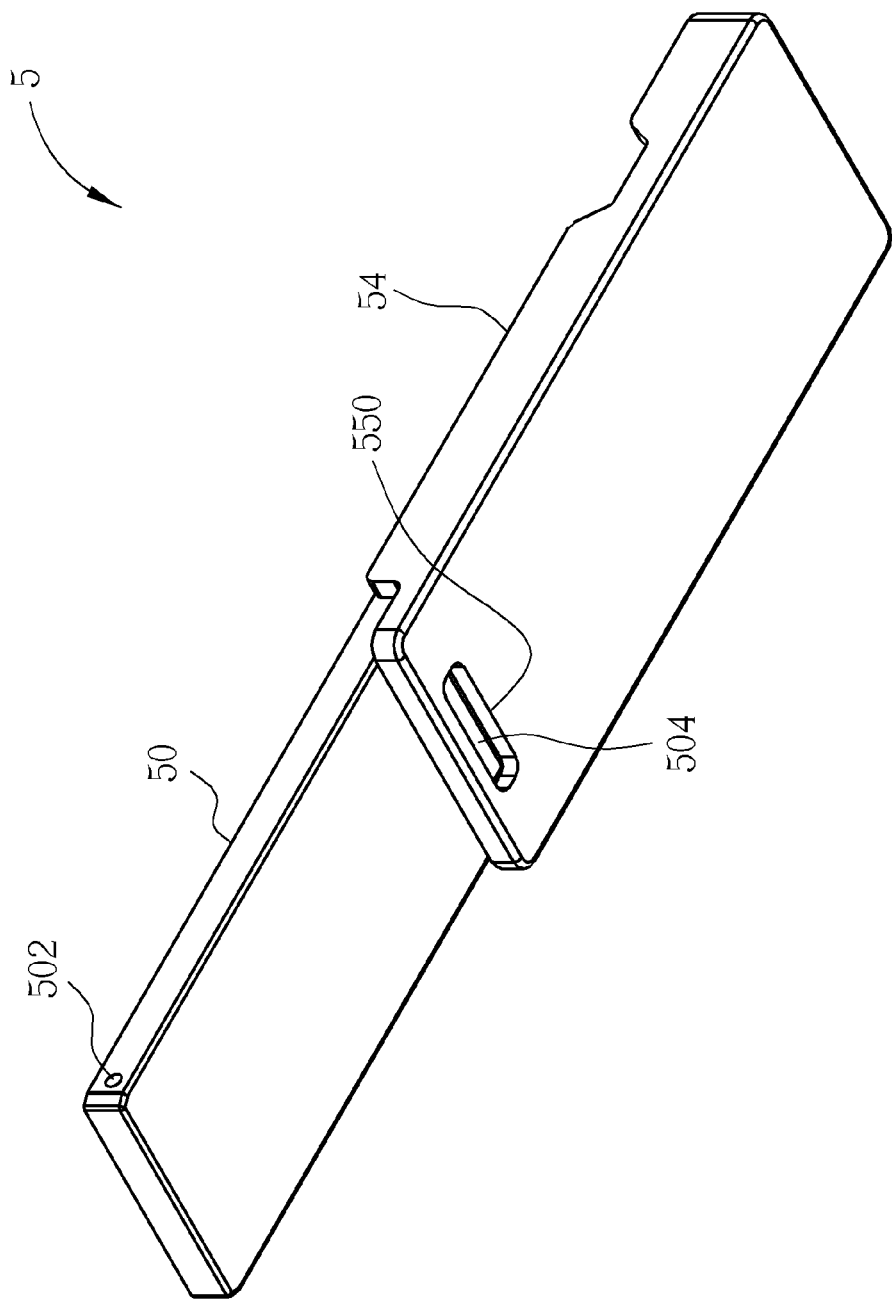
FIG. 12 is a perspective view illustrating the USB storage device shown in FIG. 11 in another view angle.

Referring to FIGS. 11 and 12, FIG. 11 is a perspective view illustrating the casing 50 shown in FIG. 3 rotating with respect to the protecting cover 54 with 180 degrees, and FIG. 12 is a perspective view illustrating the USB storage device 5 shown in FIG. 11 in another view angle. When a user wants to use the USB storage device 5, he or she has to rotate the casing 50 with respect to the protecting cover 54, so as to expose the protruding pins 520 and the flat pins 522 of the USB module 52, as shown in FIG. 11. In this embodiment, the protecting cover 54 further has a groove 548 formed on the surface 544 and between the two second pivoting portions 540, as shown in FIGS. 4, 7, 8 and 10. The USB module 52 can rotate with respect to the protecting cover 54 through the groove 548. Furthermore, the casing further has a third engaging portion 504 and the protecting cover 54 further has a fourth engaging portion 550. As shown in FIGS. 11 and 12, when the protecting cover 54 rotates with respect to the casing 50 with 180 degrees and the protruding pins 520 and the flat pins 522 of the USB module 52 are exposed, the third engaging portion 504 of the casing 50 can be engaged with the fourth engaging portion 550 of the protecting cover 54, so as to fix the casing 50 at an open position. After rotating the casing 50 with respect to the protecting cover 54 with 180 degrees, the length of the USB storage device 5 will elongate and the user can hold the elongated portion while operating the USB storage device 5. Accordingly, the convenience of operation is increased.

In this embodiment, the third engaging portion 504 may be a block and the fourth engaging portion 550 may be a longitudinal hole correspondingly. However, the third engaging portion 504 may be also a longitudinal hole and the fourth engaging portion 550 may be a block correspondingly. In other words, the third engaging portion 504 and the fourth engaging portion 550 can be designed based on practical applications and are not limited to the type shown in FIGS. 3-5, 7-10 and 12.

Figure 13:
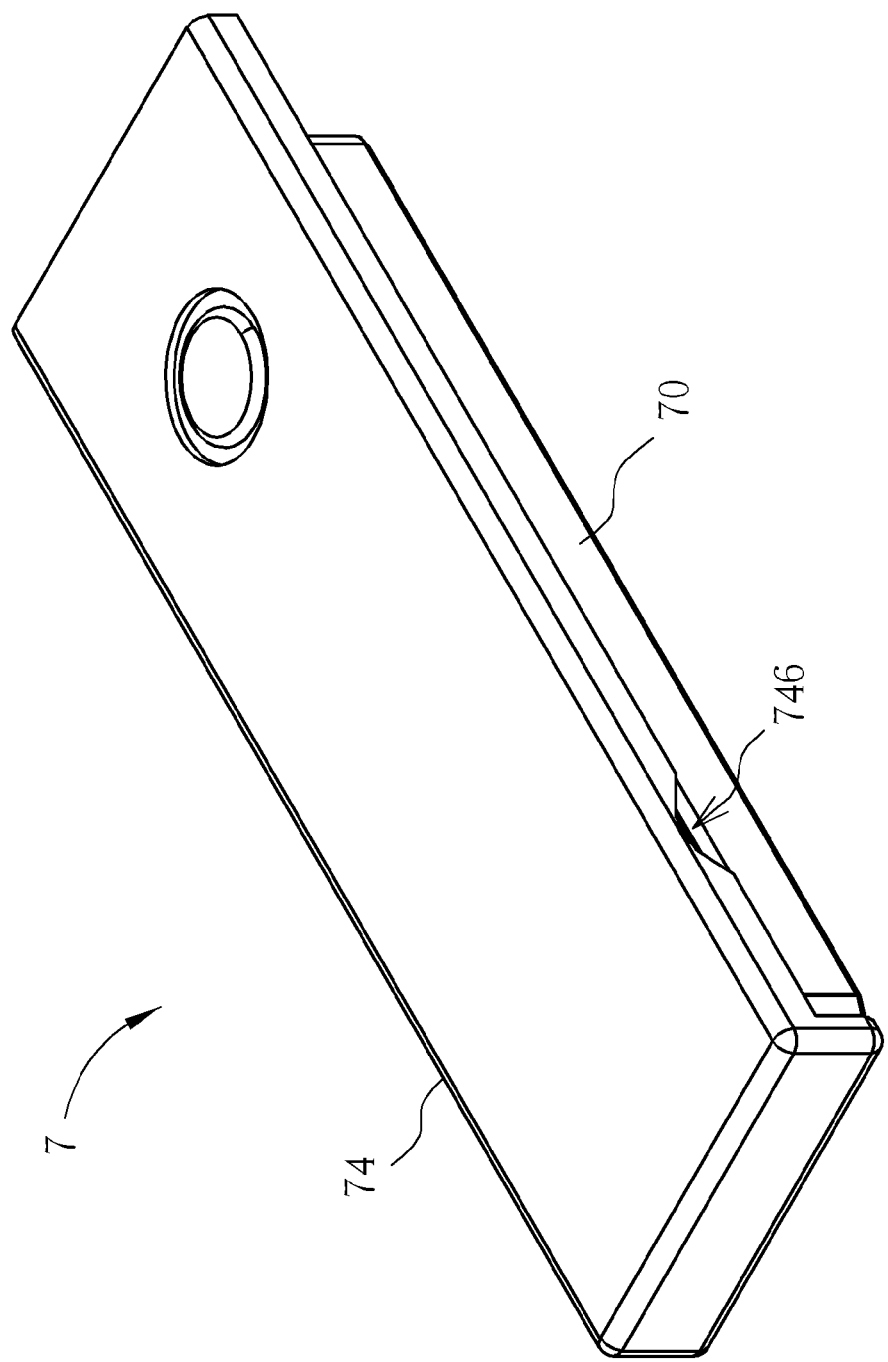
FIG. 13 is a perspective view illustrating a USB storage device according to another preferred embodiment.
Figure 14:
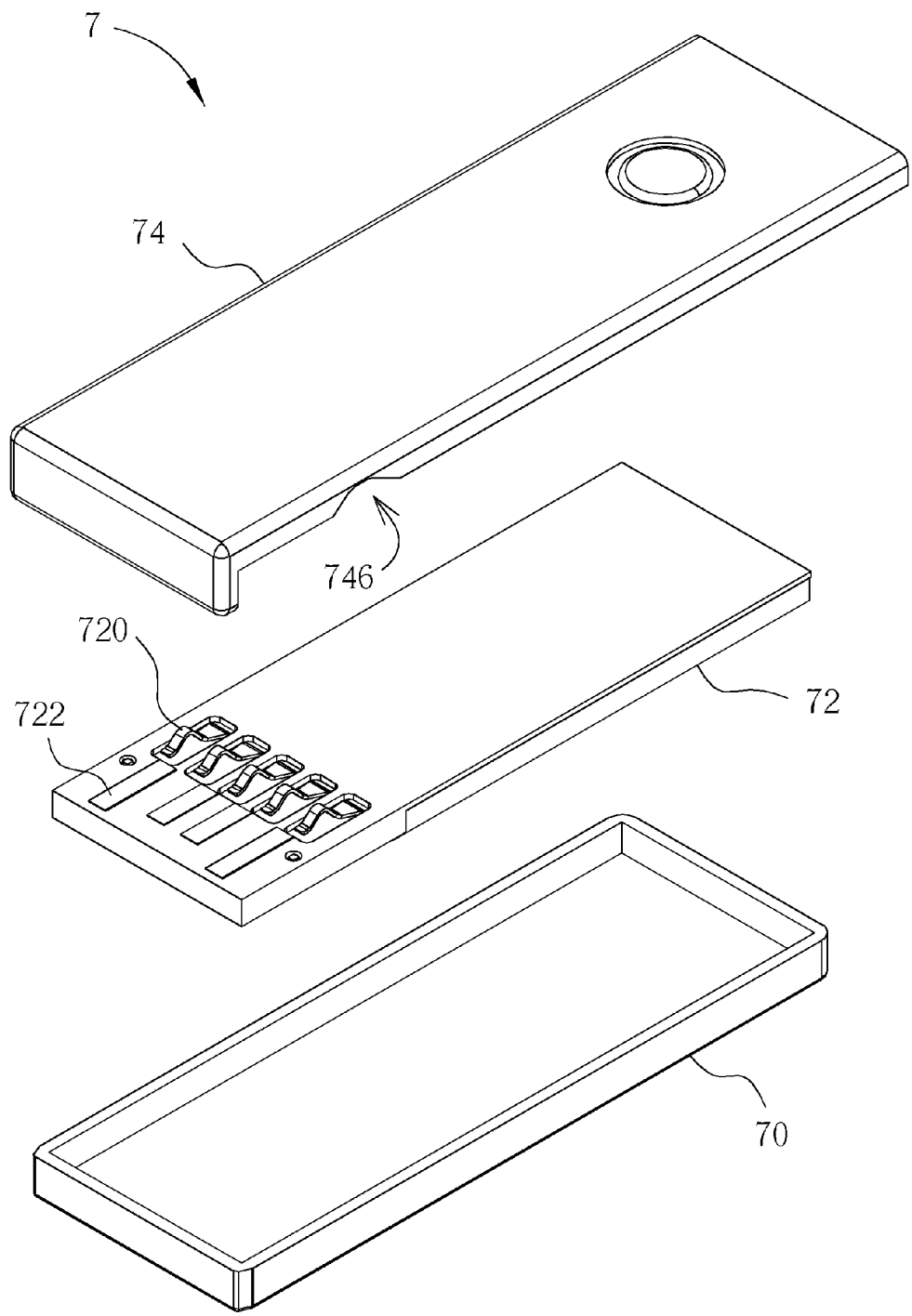
FIG. 14 is an exploded view illustrating the USB storage device shown in FIG. 13.
Figure 15:
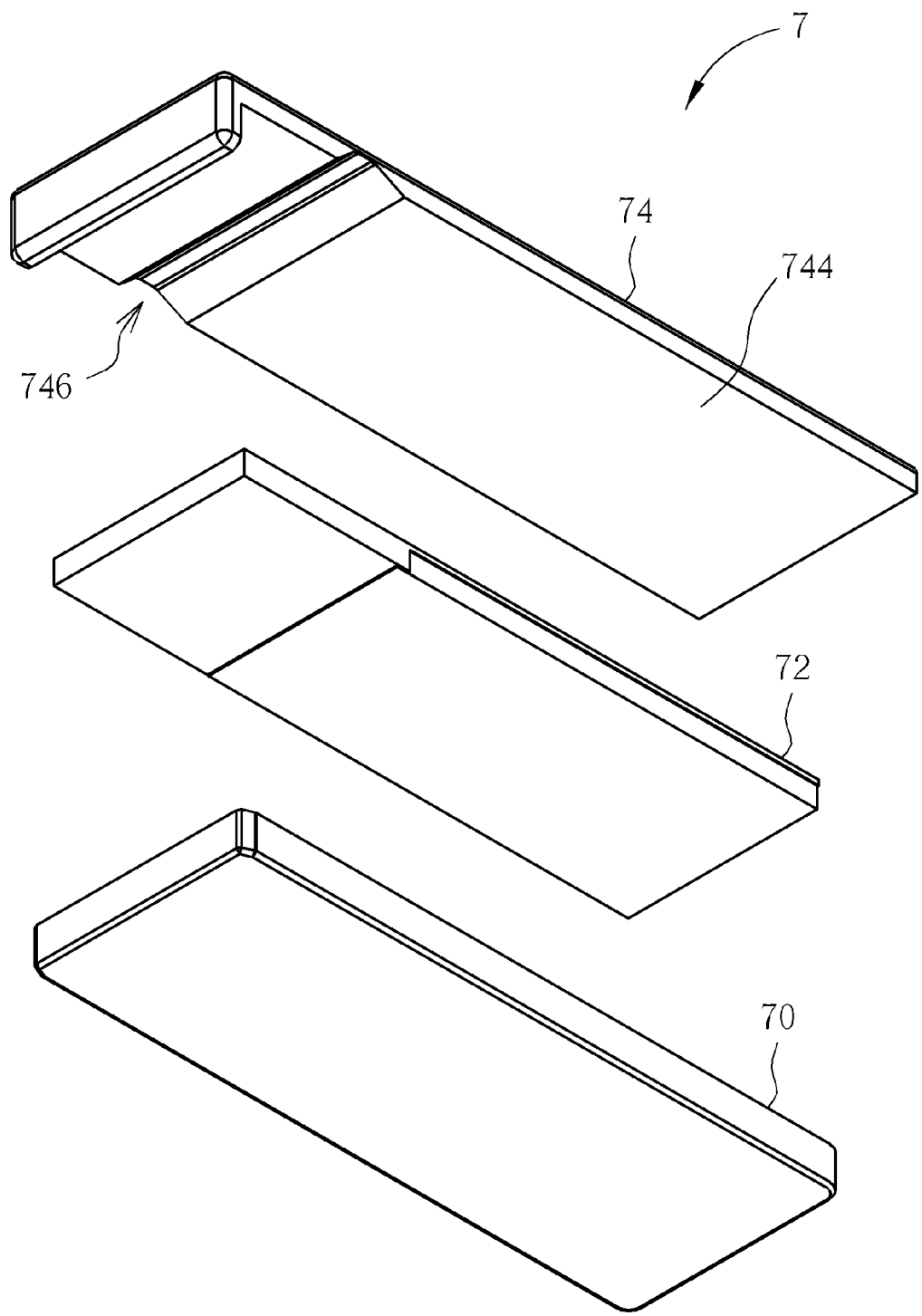
FIG. 15 is an exploded view illustrating the USB storage device shown in FIG. 13 in another view angle.
Figure 16:
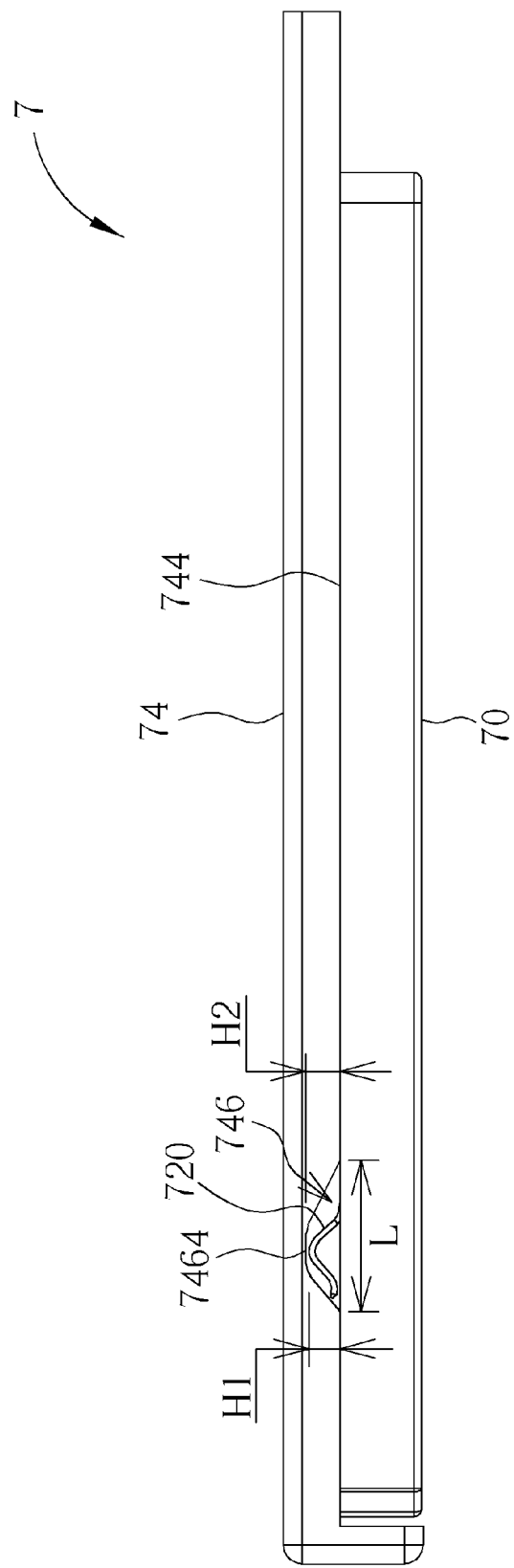
FIG. 16 is a side view illustrating the USB storage device shown in FIG. 13.

Referring to FIGS. 13 to 16, FIG. 13 is a perspective view illustrating a USB storage device 7 according to another preferred embodiment, FIG. 14 is an exploded view illustrating the USB storage device 7 shown in FIG. 13, FIG. 15 is an exploded view illustrating the USB storage device 7 shown in FIG. 13 in another view angle, and FIG. 16 is a side view illustrating the USB storage device 7 shown in FIG. 13. As shown in FIGS. 13 to 16, the USB storage device 7 comprises a casing 70, a USB module 72 and a protecting cover 74. The main deference between the USB storage device 7 and the aforesaid USB storage device 5 is that the casing 70 is pivotally connected to the protecting cover 74, such that the casing 70 is capable of rotating with respect to the protecting cover 74 in parallel.

As shown in FIG. 14, the USB module 72 comprises a plurality of protruding pins 720 and a plurality of flat pins 722. As shown in FIG. 16, each of the protruding pins 720 has a first height H1. In this embodiment, the USB module 72 is in compliance with USB 3.0 standard, the flat pins 722 are in compliance with USB 2.0 standard, and the first height H1 of each protruding pins 720 is 0.6 mm.

As shown in FIG. 15, the protecting cover 74 has a surface 744 and an accommodating space 746 formed on the surface 744. When the protecting cover 74 is connected to the casing 70 and covers the USB module 72, the protruding pins 720 can be accommodated in the accommodating space 746 without contacting the protecting cover 74, so as to achieve the purpose of protecting the protruding pins 720. In this embodiment, as shown in FIG. 16, a length L of the accommodating space 746 may be, but not limited to, 4 mm. Moreover, in this embodiment, a second height H2 is defined between the surface 744 and a bottom 7464 of the accommodating space 746. It is preferred that the second height H2 may be larger than, but not limited to, 0.8 mm.

In this embodiment, when the protecting cover 74 completely covers the USB module 72, the protruding pins 720 are accommodated in the accommodating space 746. As mentioned in the above, under USB 3.0 standard, the first height H1 of each protruding pin 720 is 0.6 mm, and the second height H2 between the surface 744 and the bottom 7464 of the accommodating space 746 is larger than 0.8 mm. Accordingly, after using the USB storage device 7, the protruding pins 720 can be accommodated in the accommodating space 746 without contacting the protecting cover 74. Therefore, the USB module 72 can be manufactured by chip on board process and the exposed protruding pins 720 can be accommodated in the accommodating space 746 of the protecting cover 74, so as to prevent the protruding pins 720 from being damaged due to collision or other accidents.

Figure 17:
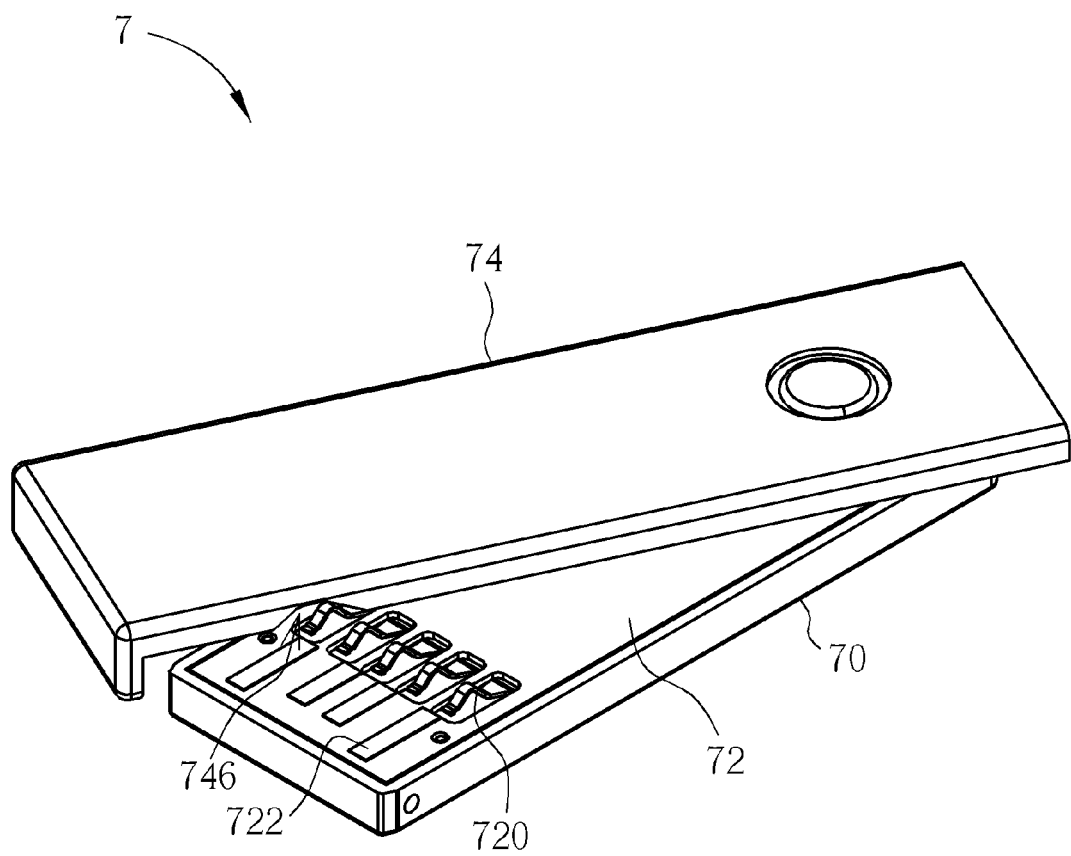
FIG. 17 is a perspective view illustrating the casing shown in FIG. 13 rotating with respect to the protecting cover.

Referring to FIG. 17, FIG. 17 is a perspective view illustrating the casing 70 shown in FIG. 13 rotating with respect to the protecting cover 74. When a user wants to use the USB storage device 7, he or she has to rotate the casing 70 with respect to the protecting cover 74, so as to expose the protruding pins 720 and the flat pins 722 of the USB module 72, as shown in FIG. 17. After rotating the casing 70 with respect to the protecting cover 74 in parallel, the length of the USB storage device 7 will elongate and the user can hold the elongated portion while operating the USB storage device 7. Accordingly, the convenience of operation is increased.

Figure 18:
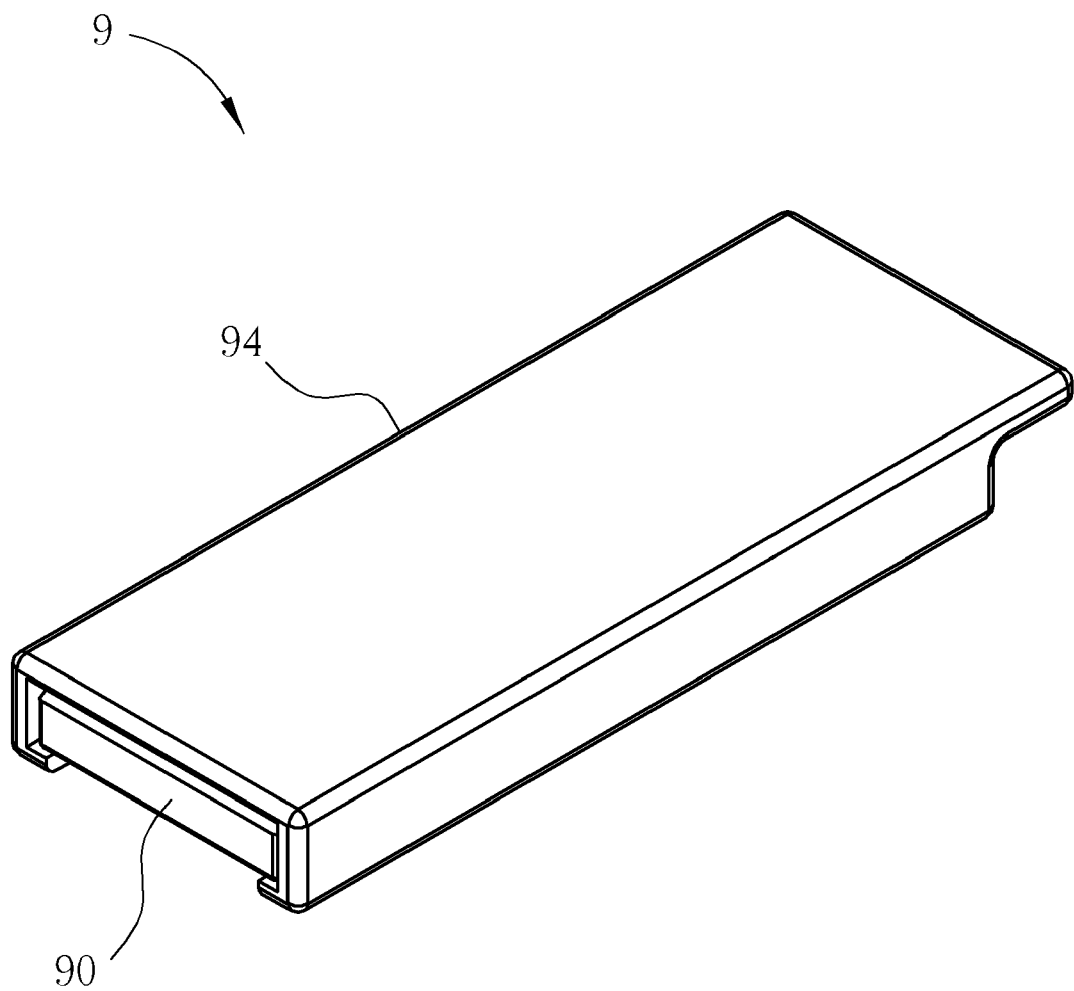
FIG. 18 is a perspective view illustrating a USB storage device according to another preferred embodiment.
Figure 19:
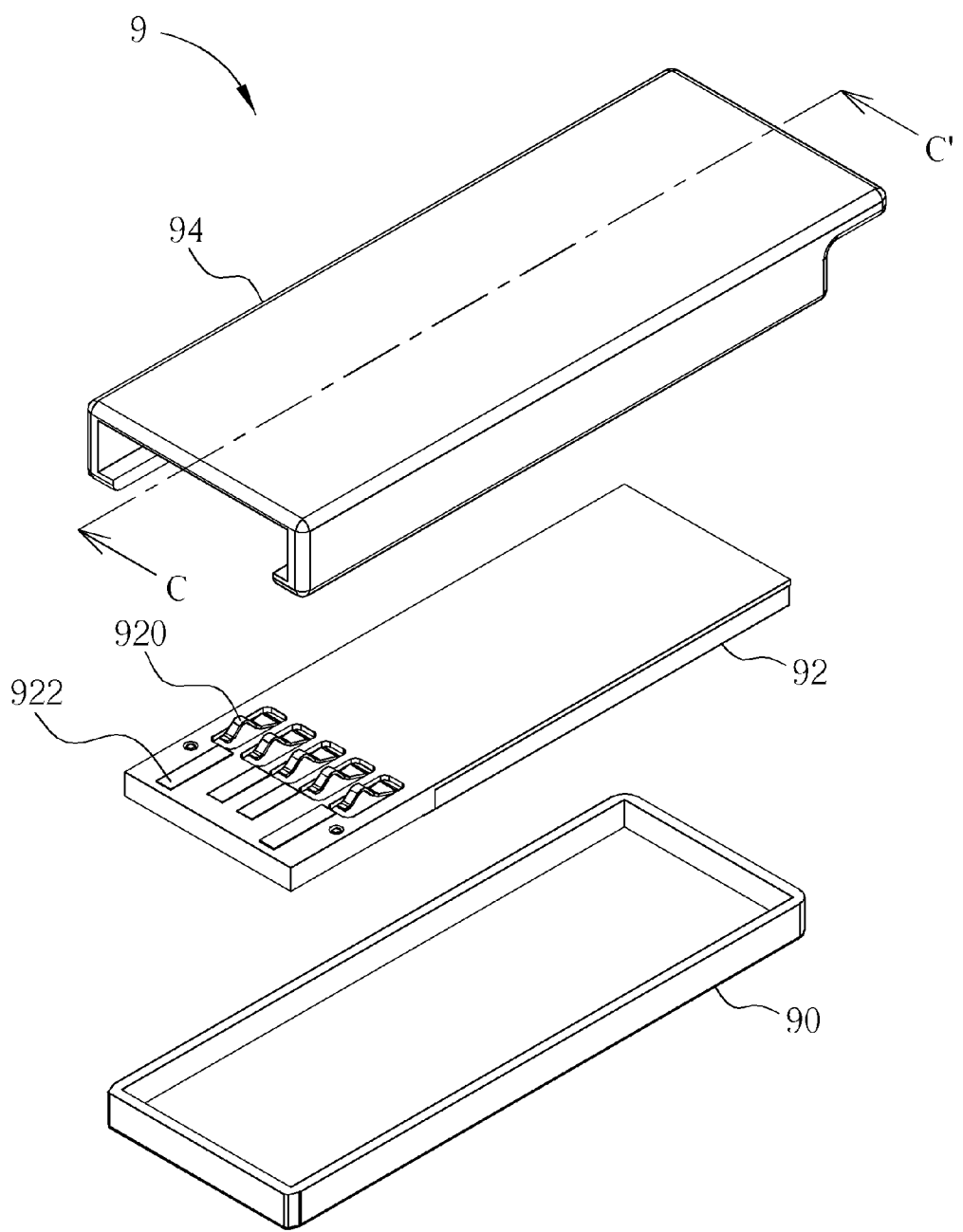
FIG. 19 is an exploded view illustrating the USB storage device shown in FIG. 18.
Figure 20:
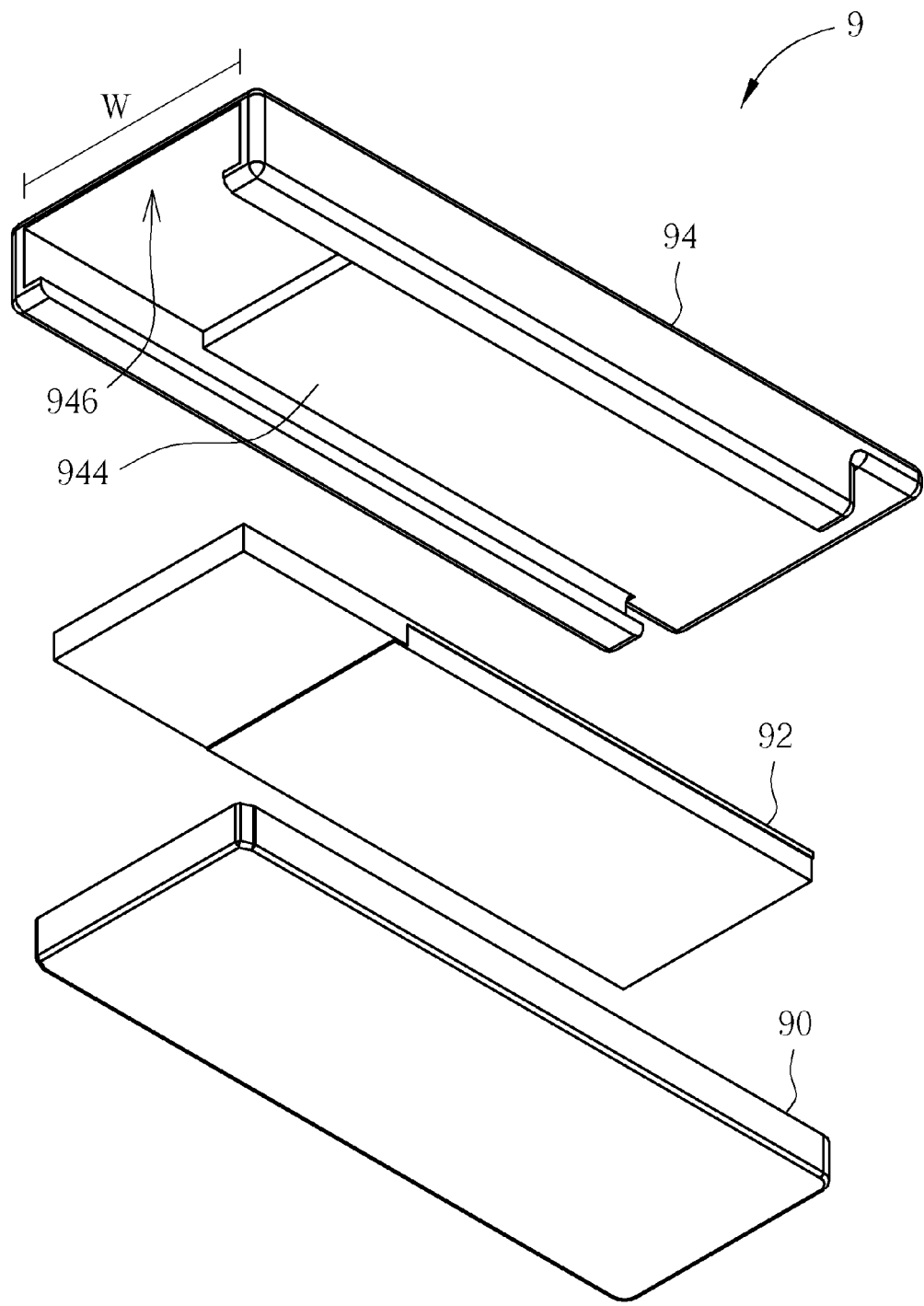
FIG. 20 is an exploded view illustrating the USB storage device shown in FIG. 18 in another view angle.
Figure 21:
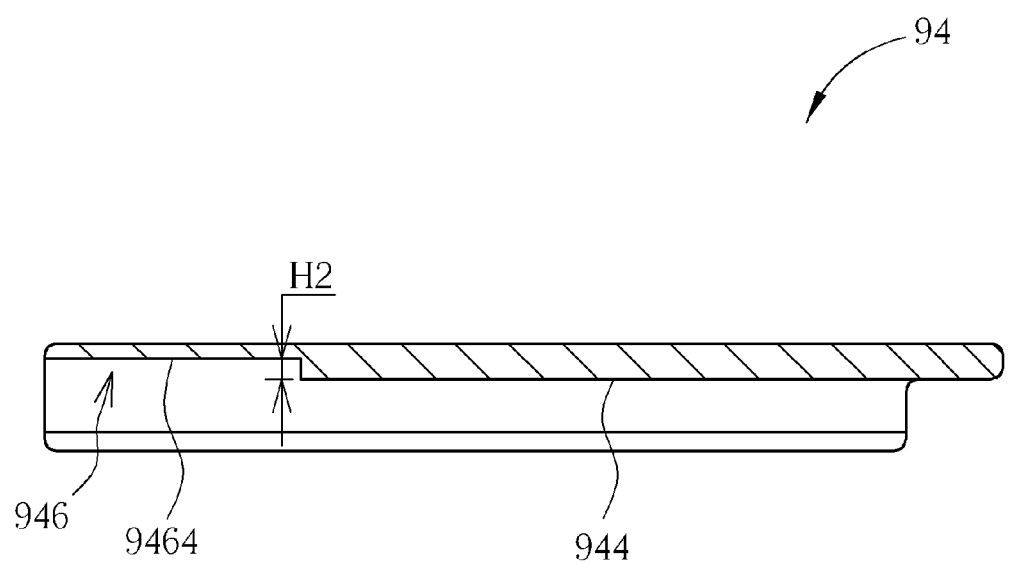
FIG. 21 is a sectional view illustrating the protecting cover along line C-C' shown in FIG. 19.

Referring to FIGS. 18 to 21, FIG. 18 is a perspective view illustrating a USB storage device 9 according to another preferred embodiment, FIG. 19 is an exploded view illustrating the USB storage device 9 shown in FIG. 18, FIG. 20 is an exploded view illustrating the USB storage device 9 shown in FIG. 18 in another view angle, and FIG. 21 is a sectional view illustrating the protecting cover 94 along line C-C' shown in FIG. 19. As shown in FIGS. 18 to 21, the USB storage device 9 comprises a casing 90, a USB module 92 and a protecting cover 94. The main deference between the USB storage device 9 and the aforesaid USB storage device 5 is that the casing 90 is movably disposed in the protecting cover 94, such that the casing 90 is capable of moving with respect to the protecting cover 94 in parallel.

As shown in FIG. 19, the USB module 92 comprises a plurality of protruding pins 920 and a plurality of flat pins 922. As mentioned in the above, each of the protruding pins 920 has a first height H1, which is the same as the first height H1 of the protruding pin 520 shown in FIG. 6. In this embodiment, the USB module 92 is in compliance with USB 3.0 standard, the flat pins 922 are in compliance with USB 2.0 standard, and the first height H1 of each protruding pins 920 is 0.6 mm.

As shown in FIG. 20, the protecting cover 94 has a surface 944 and an accommodating space 946 formed on the surface 944. When the protecting cover 94 is connected to the casing 90 and covers the USB module 92, the protruding pins 920 can be accommodated in the accommodating space 946 without contacting the protecting cover 94, so as to achieve the purpose of protecting the protruding pins 920. In this embodiment, a width W of the accommodating space 946 may be, but not limited to, 8.5 mm. Moreover, as shown in FIG. 21, in this embodiment, a second height H2 is defined between the surface 944 and a bottom 9464 of the accommodating space 946. It is preferred that the second height H2 may be larger than, but not limited to, 0.8 mm.

In this embodiment, when the protecting cover 94 completely covers the USB module 92, the protruding pins 920 are accommodated in the accommodating space 946. As mentioned in the above, under USB 3.0 standard, the first height H1 of each protruding pin 920 is 0.6 mm, and the second height H2 between the surface 944 and the bottom 9464 of the accommodating space 946 is larger than 0.8 mm. Accordingly, after using the USB storage device 9, the protruding pins 920 can be accommodated in the accommodating space 946 without contacting the protecting cover 94. Therefore, the USB module 92 can be manufactured by chip on board process and the exposed protruding pins 920 can be accommodated in the accommodating space 946 of the protecting cover 94, so as to prevent the protruding pins 920 from being damaged due to collision or other accidents.

Figure 22:
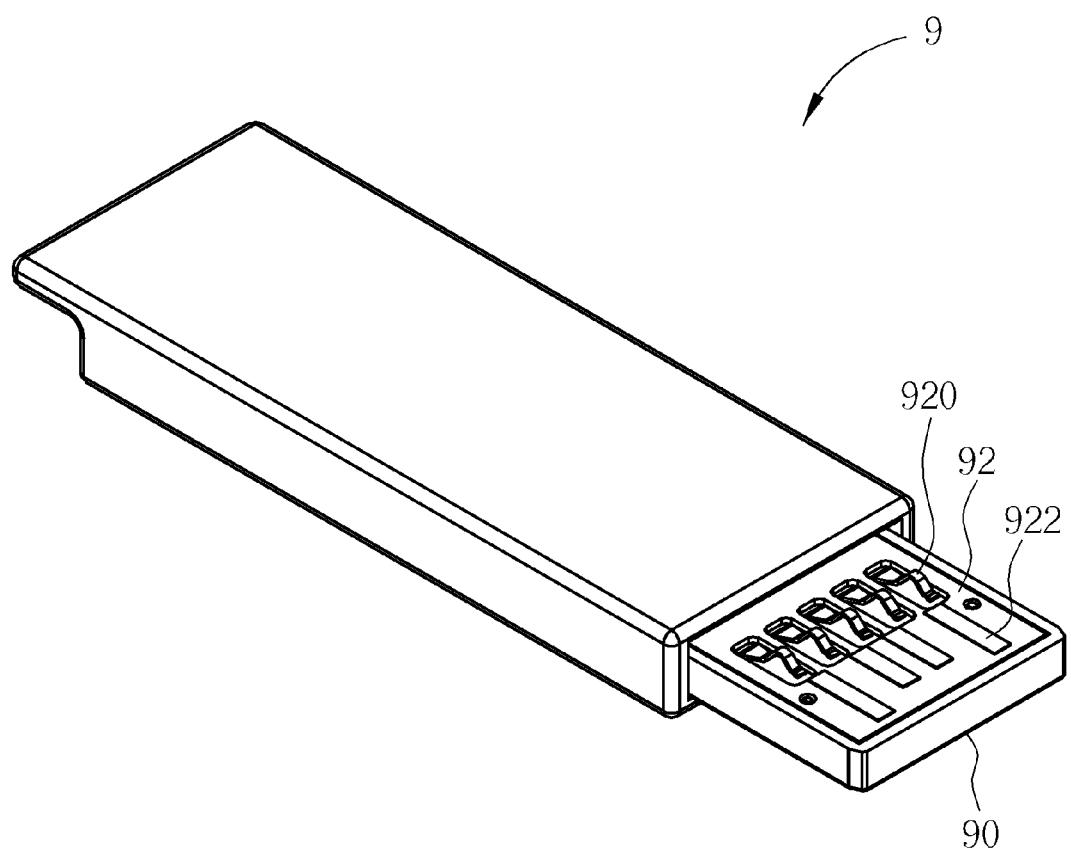
FIG. 22 is a perspective view illustrating the casing shown in FIG. 18 moving with respect to the protecting cover.

Referring to FIG. 22, FIG. 22 is a perspective view illustrating the casing 90 shown in FIG. 18 moving with respect to the protecting cover 94. When a user wants to use the USB storage device 9, he or she has to move the casing 90 with respect to the protecting cover 94, so as to expose the protruding pins 920 and the flat pins 922 of the USB module 92, as shown in FIG. 22.

According to the USB storage device (i.e. portable storage device) of the preferred embodiments, when the USB module (i.e. storage module) is manufactured by chip on board process, the exposed protruding pins can be accommodated in the accommodating space of the protecting cover, so as to prevent the protruding pins from being damaged due to collision or other accidents. Furthermore, since the accommodating space is formed on an inner surface of the protecting cover, the size of the USB storage device can be further reduced, so as to beautify the USB storage device and increase the convenience of carriage.

Those skilled in the art will readily observe that numerous modifications and alterations of the device and method may be made while retaining the teachings of the invention.

What is claimed is:

1. A USB storage device comprising:
   a casing;
   a USB module being disposed in the casing and comprising
      a plurality of protruding pins and a plurality of flat pins, each of the plurality of protruding pins having a first height; and a protecting cover being connected to the casing and selectively covering the protruding pins and the flat pins of the USB module, the protecting cover being movable with respect to the casing such that the protruding pins and the flat pins are being exposed while the USB storage device is used, the protecting cover having a surface and an accommodating space formed on the surface, wherein when the protecting cover covers the USB module, the plurality of protruding pins are accommodated in the accommodating space, a second height is defined between a bottom of the accommodating space and the surface, and the second height is larger than the first height.

2. The USB storage device of claim 1, wherein the USB module is in compliance with USB 3.0 standard, and the first height is 0.6 mm.

3. The USB storage device of claim 1, wherein the second height is larger than 0.8 mm.

4. The USB storage device of claim 1, wherein a width of the accommodating space is larger than 8.5 mm.

5. The USB storage device of claim 1, wherein the accommodating space consists of two inclined planes, and an angle between the two inclined planes is larger than 120 degrees.

6. The USB storage device of claim 1, wherein each of both sides of the casing has a first engaging portion, each of both sides of the protecting cover has a second engaging portion, and the first engaging portion is engaged with the second engaging portion when the protecting cover completely covers the USB module.

7. The USB storage device of claim 1, wherein each of both sides of the casing has a first pivoting portion, each of both sides of the protecting cover has a second pivoting portion, and the first pivoting portion is pivotally connected to the second pivoting portion, such that the casing is capable of rotating with respect to the protecting cover.

8. The USB storage device of claim 7, wherein the protecting cover further has a groove formed on the surface and between the two second pivoting portions.

9. The USB storage device of claim 7, wherein the casing has a third engaging portion, the protecting cover has a fourth engaging portion, and the third engaging portion is engaged with the fourth engaging portion when the protecting cover rotates with respect to the casing with 180 degrees and then the protruding pins are exposed.

10. The USB storage device of claim 1, wherein the casing is pivotally connected to the protecting cover, such that the casing is capable of rotating with respect to the protecting cover in parallel.

11. The USB storage device of claim 1, wherein a length of the accommodating space is larger than 4 mm.

12. The USB storage device of claim 1, wherein the casing is movably disposed in the protecting cover, such that the casing is capable of moving with respect to the protecting cover in parallel.

13. A protecting structure of a portable storage device comprising:

a casing comprising a storage module disposed therein, the storage module having a plurality of flat pins and a plurality of protruding pins; and a protecting cover being connected to the casing and selectively covering the protruding pins and the flat pins of the storage module within the casing, the protecting cover being movable with respect to the casing such that the protruding pins and the flat pins are being exposed while the portable storage device is used, the protecting cover having an accommodating space opposite to the plurality of protruding pins, such that the plurality of protruding pins are accommodated in the accommodating space without contacting the protecting cover when the protecting cover covers the casing.

14. The protecting structure of claim 13, wherein an arrangement of the flat pins and the protruding pins is in compliance with USB 3.0 standard.

15. The protecting structure of claim 13, wherein the storage module is adapted to chip on board process.

16. A protecting structure of a portable storage device comprising:

a casing comprising a storage module disposed therein, the storage module having a plurality of protruding pins and a plurality of flat pins; and means for protecting the plurality of protruding pins formed on a cover which is coupled to the casing, wherein the cover is movable with respect to the casing such that the protruding pins and the flat pins are being exposed while the portable storage device is used.

17. The protecting structure of claim 16, wherein the means for protecting the plurality of protruding pins comprises an accommodating space opposite to the plurality of protruding pins, such that the plurality of protruding pins are accommodated in the accommodating space without contacting the cover when the cover covers the casing.

* * * * *